(12) United States Patent
Freund et al.

(10) Patent No.: US 10,837,120 B2
(45) Date of Patent: Nov. 17, 2020

(54) METHOD OF MANUFACTURING CZ SILICON WAFERS, AND METHOD OF MANUFACTURING A SEMICONDUCTOR DEVICE

(71) Applicant: Infineon Technologies AG, Neubiberg (DE)

(72) Inventors: Johannes Freund, Deisenhofen (DE); Thomas Wuebben, Unterschuett (AT); Helmut Oefner, Zorneding (DE); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/830,603

(22) Filed: Mar. 26, 2020

(65) Prior Publication Data

US 2020/0224326 A1 Jul. 16, 2020

Related U.S. Application Data

(60) Continuation of application No. 16/369,419, filed on Mar. 29, 2019, which is a division of application No. (Continued)

(30) Foreign Application Priority Data

Jun. 30, 2016 (DE) .................... 10 2016 112 049

(51) Int. Cl.
*C30B 15/04* (2006.01)
*B28D 5/00* (2006.01)
(Continued)

(52) U.S. Cl.
CPC ............... *C30B 15/04* (2013.01); *B28D 5/00* (2013.01); *B28D 5/04* (2013.01); *C30B 15/02* (2013.01);
(Continued)

(58) Field of Classification Search
None
See application file for complete search history.

(56) References Cited

U.S. PATENT DOCUMENTS 4,644,172 A 2/1987 Sandland
4,705,591 A 11/1987 Carle et al.
(Continued)

FOREIGN PATENT DOCUMENTS

JP S60-94722 5/1985
JP S61-158891 7/1986
(Continued)

OTHER PUBLICATIONS

Notice of Allowance in U.S. Appl. No. 16/369,410 dated Mar. 19, 2020.

*Primary Examiner* — Zandra V Smith
*Assistant Examiner* — Lawrence C Tynes, Jr.
(74) *Attorney, Agent, or Firm* — Dicke, Billig & Czaja, PLLC

(57) ABSTRACT

One example describes a method of manufacturing Czochralski (CZ) silicon wafers. The method includes slicing an n-type CZ silicon ingot to form a plurality of CZ silicon wafers, determining a boron concentration of each CZ silicon wafer, dividing the CZ silicon wafers into sub-groups based on the boron concentration, wherein an average value of the boron concentration differs among the sub-groups, and labeling each sub-group of CZ silicon wafers with a different label which is indicative of the boron concentration.

9 Claims, 8 Drawing Sheets

Related U.S. Application Data

15/636,926, filed on Jun. 29, 2017, now Pat. No. 10,273,597.

(51) Int. Cl.

| | | |
|---|---|---|
| *C30B 15/02* | (2006.01) | |
| *H01L 29/739* | (2006.01) | |
| *C30B 15/10* | (2006.01) | |
| *C30B 29/06* | (2006.01) | |
| *C30B 33/00* | (2006.01) | |
| *B28D 5/04* | (2006.01) | |
| *H01L 21/66* | (2006.01) | |
| *H01L 29/66* | (2006.01) | |

(52) U.S. Cl.
CPC .............. *C30B 15/10* (2013.01); *C30B 29/06* (2013.01); *C30B 33/00* (2013.01); *H01L 22/14* (2013.01); *H01L 29/66325* (2013.01); *H01L 29/7393* (2013.01); *H01L 22/20* (2013.01)

(56) References Cited

U.S. PATENT DOCUMENTS

| | | |
|---|---|---|
| 5,537,325 A | 7/1996 | Iwakiri |
| 5,757,264 A | 5/1998 | Petit |
| 6,799,311 B1 | 9/2004 | Ryskoski |
| 6,924,540 B2 | 8/2005 | Shirakawa et al. |
| 7,257,459 B1 | 8/2007 | Qu |
| 7,738,988 B2 | 6/2010 | Jones |
| 8,061,225 B2 | 11/2011 | Inami |
| 9,245,811 B2 | 1/2016 | Ploss et al. |
| 9,786,748 B2 * | 10/2017 | Caspary .................. C30B 29/06 |
| 2003/0003608 A1 | 1/2003 | Anikado et al. |
| 2006/0213988 A1 | 9/2006 | Wang |
| 2006/0214794 A1 | 9/2006 | Wang |
| 2009/0217516 A1 | 9/2009 | Pawlowski |
| 2010/0327890 A1* | 12/2010 | Ounadjela ............. C01B 33/037 |
| | | 324/719 |
| 2013/0006564 A1 | 1/2013 | Chavet |
| 2015/0349066 A1* | 12/2015 | Caspary ............. H01L 29/0878 |
| | | 257/655 |

FOREIGN PATENT DOCUMENTS

| | | |
|---|---|---|
| JP | H11-278983 | 10/1999 |
| JP | 2002-76082 | 3/2002 |
| JP | 2003-212692 | 7/2003 |
| JP | 2011-187706 | 9/2011 |
| JP | 2015-226066 | 12/2015 |

* cited by examiner

FIG 5
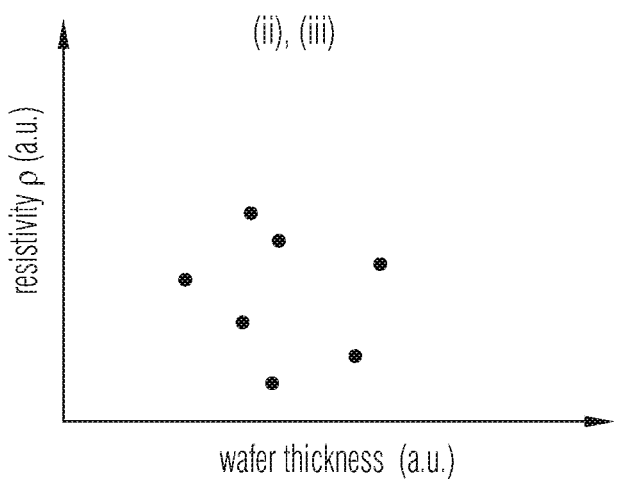
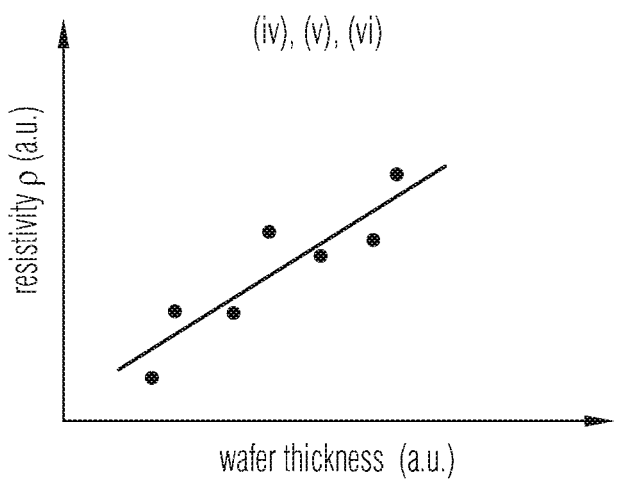

METHOD OF MANUFACTURING CZ SILICON WAFERS, AND METHOD OF MANUFACTURING A SEMICONDUCTOR DEVICE

CROSS-REFERENCE TO RELATED APPLICATION

This Utility patent application is a continuation application of U.S. Ser. No. 16/369,419, filed Mar. 29, 2019, which is a divisional application of U.S. Ser. No. 15/636,926 filed Jun. 29, 2017 and claims priority to German Patent Application No. 10 2016 112 049.9, filed Jun. 30, 2016, all of which are incorporated herein by reference.

BACKGROUND

In silicon devices such as insulated gate bipolar transistors (IGBTs), diodes, insulated gate field effect transistors (IGFETs), for example metal oxide semiconductor field effect transistors (MOSFETs) a number of requirements need to be met. Such requirements depend upon specific application conditions. Typically, trade-offs between linked characteristics such as, for example high electrical breakdown voltage and low on-state resistance have to be found. Avalanche breakdown events and undesired formation of inversion channels, for example at silicon to oxide interfaces that may occur during operation of the semiconductor device may have a negative impact on device robustness and device reliability.

As a typical base material for manufacturing a variety of such semiconductor devices, silicon wafers grown by the Czochralski (CZ) method, e.g. by the standard CZ method or by the magnetic CZ (MCZ) method or by the Continuous CZ (CCZ) method are used. In the Czochralski method, silicon is heated in a crucible to the melting point of silicon at around 1416° C. to produce a melt of silicon. A small silicon seed crystal is brought in contact with the melt. Molten silicon freezes on the silicon seed crystal. By slowly pulling the silicon seed crystal away from the melt, a crystalline silicon ingot is grown with a diameter in the range of one or several 100 mm and a length in the range of a meter or more. In the MCZ method, additionally an external magnetic field is applied to reduce an oxygen contamination level.

Growing of silicon with defined doping by the Czochralski method is complicated by segregation effects. The segregation coefficient of a dopant material characterizes the relation between the concentration of the dopant material in the growing crystal and that of the melt. Typically, dopant materials have segregation coefficients lower than one meaning that the solubility of the dopant material in the melt is larger than in the solid. This typically leads to an increase of doping concentration in the ingot with increasing distance from the seed crystal.

Since in Czochralski grown silicon ingots, depending upon application of the grown silicon, a tolerance range of doping concentration or specific resistance along the axial direction between opposite ends of the silicon ingot may be smaller than the variability of doping concentration or specific resistance caused by segregation effects during CZ growth, it is desirable to provide a method of manufacturing silicon wafers and to provide a method of manufacturing a semiconductor device that allow for an improved yield of semiconductor devices of a target device specification based on the CZ semiconductor wafers.

SUMMARY

The present disclosure relates to a method of manufacturing CZ silicon wafers. In one example, the method includes slicing an n-type CZ silicon ingot to form a plurality of CZ silicon wafers, determining a boron concentration of each CZ silicon wafer, dividing the CZ silicon wafers into sub-groups based on the boron concentration, wherein an average value of the boron concentration differs among the sub-groups, and labeling each sub-group of CZ silicon wafers with a different label which is indicative of the boron concentration.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the disclosure and are incorporated in and constitute a part of this specification. The drawings illustrate the embodiments of the present disclosure and together with the description serve to explain principles of the disclosure. Other embodiments and intended advantages will be readily appreciated as they become better understood by reference to the following detailed description.

FIG. 5 are schematic views for illustrating correlations between resistivity and wafer thickness when manufacturing a semiconductor device based on the methods illustrated in FIG. 4.

DETAILED DESCRIPTION

Figure 1:
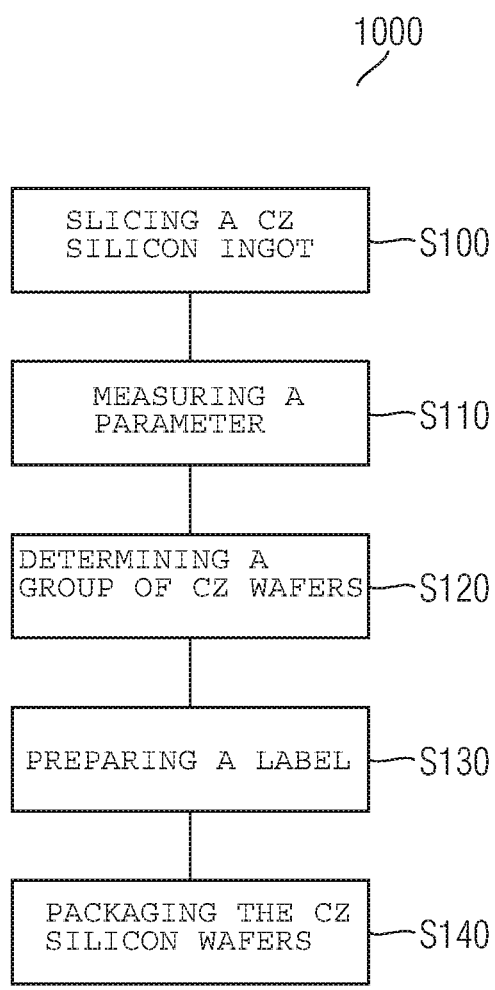
FIG. 1 is a schematic process chart illustrating a method of manufacturing CZ silicon wafers.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may exist between the electrically coupled elements, for example elements that temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration that is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

The terms "wafer", "substrate", "semiconductor body" or "semiconductor substrate" used in the following description may include any semiconductor-based structure that has a semiconductor surface. Wafer and structure are to be understood to include silicon (Si), silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon germanium (SiGe), germanium (Ge) or gallium arsenide (GaAs). According to other embodiments, silicon carbide (SiC) or gallium nitride (GaN) may form the semiconductor substrate material.

The term "horizontal" as used in this specification intends to describe an orientation substantially parallel to a first or main surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate or semiconductor body is considered to be formed by the lower or backside surface while the first surface is considered to be formed by the upper, front or main surface of the semiconductor substrate. The terms "above" and "below" as used in this specification therefore describe a relative location of a structural feature to another In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped.

Processing of a semiconductor wafer may result in semiconductor devices having terminal contacts such as contact pads (or electrodes) which allow electrical contact to be made with the integrated circuits or discrete semiconductor devices included in the semiconductor body. The electrodes may include one or more electrode metal layers which are applied to the semiconductor material of the semiconductor chips. The electrode metal layers may be manufactured with any desired geometric shape and any desired material composition. The electrode metal layers may, for example, be in the form of a layer covering an area. Any desired metal, for example Cu, Ni, Sn, Au, Ag, Pt, Pd, and an alloy of one or more of these metals may be used as the material. The electrode metal layer(s) need not be homogenous or manufactured from just one material, that is to say various compositions and concentrations of the materials contained in the electrode metal layer(s) are possible. As an example, the electrode layers may be dimensioned large enough to be bonded with a wire.

In embodiments disclosed herein one or more conductive layers, in particular electrically conductive layers, are applied. It should be appreciated that any such terms as "formed" or "applied" are meant to cover literally all kinds and techniques of applying layers. In particular, they are meant to cover techniques in which layers are applied at once as a whole like, for example, laminating techniques as well as techniques in which layers are deposited in a sequential manner like, for example, sputtering, plating, molding, CVD (Chemical Vapor Deposition), physical vapor deposition (PVD), evaporation, hybrid physical-chemical vapor deposition (HPCVD), etc.

The applied conductive layer may comprise, inter alia, one or more of a layer of metal such as Cu or Sn or an alloy thereof, a layer of a conductive paste and a layer of a bond material. The layer of a metal may be a homogeneous layer. The conductive paste may include metal particles distributed in a vaporizable or curable polymer material, wherein the paste may be fluid, viscous or waxy. The bond material may be applied to electrically and mechanically connect the semiconductor chip, e.g., to a carrier or, e.g., to a contact clip. A soft solder material or, in particular, a solder material capable of forming diffusion solder bonds may be used, for example solder material comprising one or more of Sn, SnAg, SnAu, SnCu, In, InAg, InCu and InAu.

A dicing process may be used to divide the semiconductor wafer into individual chips. Any technique for dicing may be applied, e.g., blade dicing (sawing), laser dicing, etching, etc. The semiconductor body, for example a semiconductor wafer may be diced by applying the semiconductor wafer on a tape, in particular a dicing tape, apply the dicing pattern, in particular a rectangular pattern, to the semiconductor wafer, e.g., according to one or more of the above mentioned techniques, and pull the tape, e.g., along four orthogonal directions in the plane of the tape. By pulling the tape, the semiconductor wafer gets divided into a plurality of semiconductor dies (chips).

FIG. 1 is a schematic flow diagram for illustrating a method 1000 of manufacturing CZ silicon wafers.

It will be appreciated that while method 1000 is illustrated and described below as a series of acts or events, the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects of embodiments of the disclosure herein. Also, one or more of the acts depicted herein may be carried out in one or more separate act and/or phases.

Optional process feature S100 includes slicing a CZ silicon ingot or a CZ silicon ingot section into CZ silicon wafers. In some embodiments, the CZ silicon ingot is formed by the magnetic CZ (MCZ) method which is carried out within a strong horizontal (HMCZ) or vertical (VMCZ) magnetic field. This serves to control the convection fluid flow, thereby allowing for a lower oxygen concentration and more homogeneous impurity distribution compared with wafers manufactured according to the standard CZ method. Slicing may be carried out based on a wire saw and/or an inner diameter (ID) saw, for example. The CZ silicon ingot results from growing the crystal by the CZ growth method and removing the seed-end, i.e. the top and the tapered-end, i.e. the bottom by using a saw, for example an ID saw. These ends may be discarded or re-melted for re-use in future crystal growth processes. After cutting the ends off, the ingot may be cut into shorter sections in order to optimize the slicing operation. The ingot may also be sliced without being cut into shorter sections if the slicing equipment is capable of processing corresponding ingot dimensions.

Process feature S110 includes measuring a parameter of at least two of the CZ silicon wafers. The parameter may be one parameter out of a variety of parameters that are measured for characterizing the semiconductor wafers cut from the ingot. The parameter may be measured with respect to each of the semiconductor wafers cut from the ingot or may be measured based on two or more of the semiconductor wafers cut from the ingot, whereas parameter values may be calculated for others of the semiconductor wafers based on the measured parameter value(s). By way of example, an impact of the segregation effects on the resistivity along an axial direction of the ingot may simulated starting from the measured values as boundary condition(s).

Process feature S120 includes determining a group of the CZ silicon wafers falling within a tolerance of a target specification. The tolerance of the target specification may include a number of parameters and tolerances including the parameter measured by process feature S110. Examples of parameters specified in the target specification by target parameter value and tolerance include resistivity, diameter, thickness, total thickness variation (TTV), bow, and warp, for example.

Process feature S120 includes dividing the group of the CZ silicon wafers into sub-groups taking into account the measured parameter, wherein an average value of the parameter of the CZ silicon wafers of each sub-group differs among the sub-groups, and a tolerance of the parameter of the CZ silicon wafers of each sub-group is smaller than a tolerance of the parameter of the target specification.

In some embodiments, the group of the CZ silicon wafers is divided into two, three, four or even more sub-groups. By way of example, when dividing the group of the CZ silicon wafers into two sub-groups, i.e. a first sub-group and a second sub-group, the CZ silicon wafers of the first sub-group may include those wafers of the group of the CZ silicon wafers having a resistivity larger than the resistivity of the wafers of the second sub-group. By way of example, when the specified tolerance of a target resistivity ρ of the CZ silicon wafers is +/−x %, for example +/−14%, the tolerance of the wafers of each of the first and second sub-groups may be +/−(x/2)%, for example +/−7%, whereas an average value of the resistivity of the semiconductor wafers of the first group may be larger than an average value of the resistivity of the semiconductor wafers of the second group. Both average values, i.e. the average value of the resistivity of the semiconductor wafers of the first group and the average value of the resistivity of the semiconductor wafers of the second group fall within the tolerance of the target specification of the group of CZ silicon wafers that will be shipped to a customer.

Process feature S130 includes preparing a labeling configured to distinguish between the CZ silicon wafers of the different sub-groups. The labeling may be any kind of labeling that allows to distinguish the CZ silicon wafers of different sub-groups. In some embodiments, the labeling distinguishes between the silicon wafers of different sub-groups by a position in the shipping case. Positions in the shipping case housing wafers of the first group may be distinguished from other positions in the shipping case housing wafers of the second group by a marking on the case, for example different markings for the sub-groups placed at the different positions in the shipping case or an adhesive label on the shipping case assigning the shipping case positions to wafers of the first or second sub-group, respectively. In some other embodiments, the labeling distinguishes between the CZ silicon wafers of different sub-groups by a mark on the CZ silicon wafers. In some embodiments, the mark is formed by using laser technology, for example to place a permanent and highly-readable mark on a surface of the wafers to allow traceability of the wafers at least up to semiconductor manufacturing processes that are carried out based on different process parameters for the semiconductor wafers of the first and second sub-groups, respectively. By way of example, the semiconductor wafers of the first sub-group may be thinned to a different thickness than the semiconductor wafers of the second sub-group based on the information gathered by analyzing the labeling.

Process feature S140 includes packaging the CZ silicon wafers falling within the tolerance of the target specification. In some embodiments, the CZ silicon wafers falling within the tolerance of the target specification are packaged in a same shipping case. Thus, the semiconductor wafers of the first and second sub-groups are packaged in the same shipping case.

The process features described above have been illustrated based on a division of the semiconductor wafers fulfilling the target specification into two sub-groups. A division of the semiconductor wafers fulfilling the target specification into more than two, for example three, four or even more sub-groups may accordingly be carried out.

Figure 2:
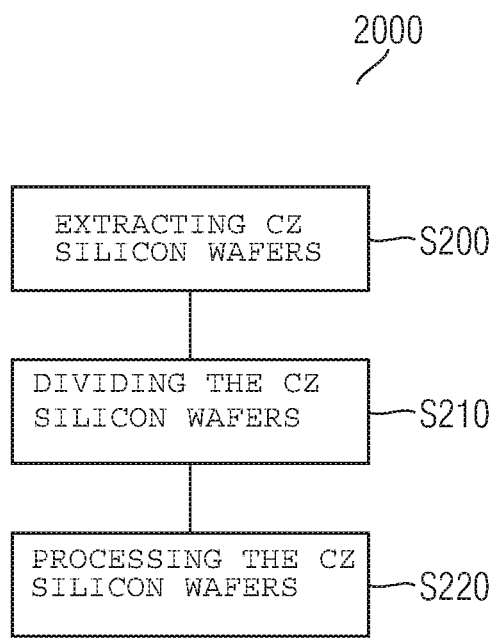
FIG. 2 is a schematic process chart illustrating a method of manufacturing a semiconductor device in CZ silicon wafers.

FIG. 2 is a schematic flow diagram for illustrating a method 2000 of manufacturing a semiconductor device.

It will be appreciated that while method 2000 is illustrated and described below as a series of acts or events, the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects of embodiments of the disclosure herein. Also, one or more of the acts depicted herein may be carried out in one or more separate act and/or phases.

Optional process feature S200 includes extracting CZ silicon wafers falling within a tolerance of a target wafer specification from a shipping case.

Process feature S210 includes dividing the CZ silicon wafers into sub-groups based on measuring a semiconductor material parameter of at least two of the CZ silicon wafers or based on analyzing a labeling configured to distinguish between the CZ silicon wafers of different sub-groups, wherein an average value of a parameter of the CZ silicon wafers differs among the sub-groups, and a tolerance of the parameter of the CZ silicon wafers of each sub-group is smaller than a tolerance of the parameter of the target specification. Measuring of the semiconductor material parameter may be based on two, three, or more than three, or even all of the CZ semiconductor wafers of the CZ silicon ingot or of the CZ silicon ingot section, whereas values of the semiconductor material parameter may be calculated for the other semiconductor wafers, i.e. the semiconductor wafers that have not been subject to measurement of the semiconductor material parameter. The calculation may be based on the measured parameter values provided that a position of the semiconductor wafer in the ingot from where it has been cut is known, for example by a mark on the wafer and/or a position in the shipping case and/or a or an adhesive label on the shipping case. By way of example, an impact of the segregation effects on the resistivity along an axial direction of the ingot may be simulated starting from the measured material parameter value(s) as boundary condition(s). The division of the CZ silicon wafers into the sub-groups may also be carried out based on a labeling of the CZ silicon wafers in the shipping case. Further details on the labeling are given above with respect to the process feature S130 illustrated in FIG. 1.

Process feature S220 includes processing the CZ silicon wafers based on process parameters that at least partly differ among the CZ silicon wafers of different sub-groups. Processing may include Front-end-of-line (FEOL) processes and Back-end-of-line (BEOL) processes. FEOL processes are the first processes in integrated circuit or discrete semiconductor fabrication, involving the formation of devices including transistors, capacitors, resistors, and more directly in the silicon wafer. BEOL processing involves a series of processes used to prepare integrated circuits for use. These processes include interconnects, wafer thinning, wafer dicing, inspection, die sort and final packaging. The devices in the silicon wafer may be interconnected to provide a desired electrical circuit functionality. Wires such as patterned metallization layers isolated by dielectric layers may be used to interconnect the individual devices.

In some embodiments, the CZ silicon wafers of the different sub-groups are thinned to different target thicknesses. Wafer thinning is a process in which wafer material is removed from a back side of wafer, thereby producing a thinner wafer that allows for an adjustment of on-state resistance and heat dissipation behavior, for example. The process of thinning may be carried out by one or more processes such as backgrinding in an automated backgrinding machine based on computer-controlled grinding wheels, chemical and plasma etching processes, for example.

In some embodiments, the CZ silicon wafers of the sub-group having the larger mean resistivity are thinned to a larger target thickness than the CZ silicon wafers of the sub-group having the smaller mean resistivity. For example, for an increase of the mean resistivity of the wafers in a sorted group by 5% to 10%, the thickness may be increased e.g. by 2 to 10 micrometers or by 3 to 8 micrometers. Thereby, a softness during switching of transistors formed in the wafers of the different sub-groups from an on-state into an off-state may be adapted to each other. Likewise, an avalanche breakdown robustness of transistors formed in the wafers of the different sub-groups may be adapted to each other.

Some embodiments include forming an IGBT in the CZ silicon wafers, wherein dopants of a rear side emitter of the IGBT are implanted with different implant doses for silicon wafers of different sub-groups. In some embodiments, the implant dose of the CZ silicon wafers of the sub-group having the larger mean resistivity is set larger (or smaller in some applications) than the implant dose of the CZ silicon wafers of the sub-group having the smaller mean resistivity, for example by 2% to 20%, or by 4% to 8%. Thereby, a softness during switching of IGBTs formed in the wafers of the different sub-groups from an on-state into an off-state may be adapted to each other. It may be useful to combine the adaption of the wafer thickness and the backside emitter doping e.g. by increasing the wafer thickness by 3 to 8 micrometers combined with an increase of the backside emitter implantation dose by more than 5%, or even more than 10%, or even more than 20%.

Some embodiments include forming a transistor in the CZ silicon wafers, wherein dopants of a field stop zone of the transistor are implanted with different implant doses for silicon wafers of different sub-groups. e.g. When using proton irradiation for manufacturing of the field stop zone, the proton implantation dose or doses (when using multiple implantation energies) may be decreased (or increased in some applications) by more than 10% for an increase of the mean resistivity of the wafers in a sorted group e.g. by 5% to 10%. When using phosphorus or selenium implantation for formation of the field stop zone, the proton implantation dose or doses (when using multiple implantation energies) may be decreased by more than 3% for an increase of the mean resistivity of the wafers in a sorted group e.g. by 5% to 10%. Thereby, a rear side emitter efficiency of an IGBT and a transport factor of an FET or IGBT formed in the wafers of the different sub-groups may be adapted to each other.

Some embodiments include forming a transistor in the CZ silicon wafers, wherein a resistance of a gate resistor is formed based on different values for silicon wafers of different sub-groups. Thereby, a switching behavior of transistors formed in the wafers of the different sub-groups may be adapted to each other.

Figure 3:
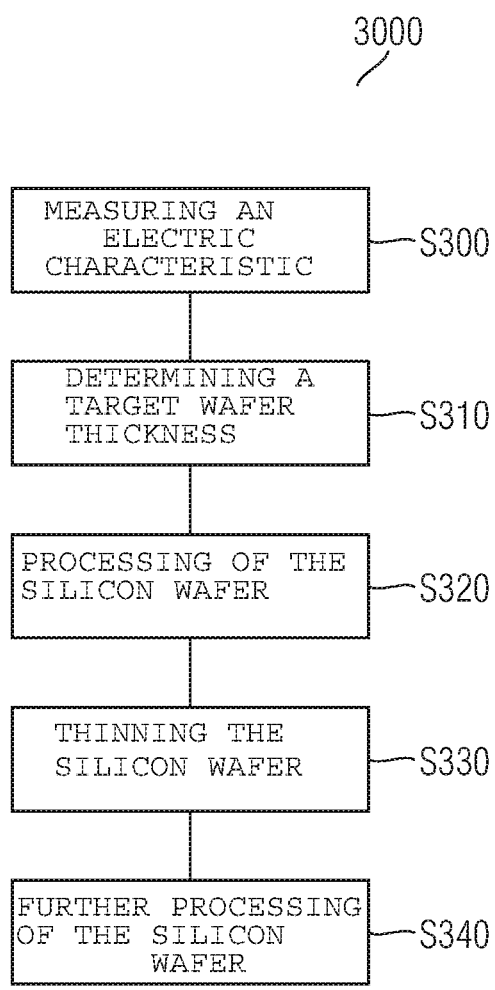
FIG. 3 is a schematic process chart illustrating another method of manufacturing a semiconductor device in CZ silicon wafers.

FIG. 3 is a schematic flow diagram for illustrating a method 3000 of manufacturing a semiconductor device in a silicon wafer.

It will be appreciated that while method 3000 is illustrated and described below as a series of acts or events, the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects of embodiments of the disclosure herein. Also, one or more of the acts depicted herein may be carried out in one or more separate act and/or phases.

Process feature S300 includes measuring an electric characteristic of the silicon wafer. The measured electric characteristic may be a resistivity, for example.

Process feature S310 includes determining a target wafer thickness based on the measured electric characteristic. The target wafer thickness may, besides the measured electric characteristic, be calculated based on further parameters, for example target values of on-state resistance of a transistor, blocking voltage between load terminals such as source and drain of an insulated gate field effect transistor or emitter and collector of an IGBT or based on the softness during turn-off of IGBTs or diodes.

Process feature S320 includes processing of the silicon wafer. In some embodiments, processing includes FEOL processes as described above with respect to process feature S210 of FIG. 2.

Process feature S330 includes thinning the silicon wafer to the target wafer thickness. Thinning may be carried out as described above with reference to process feature S220 of FIG. 2.

Process feature S340 includes further processing of the silicon wafer. In some embodiments, further processing includes FEOL and BEOL processes as described above with respect to process feature S210 of FIG. 2.

In some embodiments, the electric characteristic is a map of individual values of an electric parameter measured at different positions on the wafer surface. The electric characteristic may include one or more values of resistivity.

Figure 4:
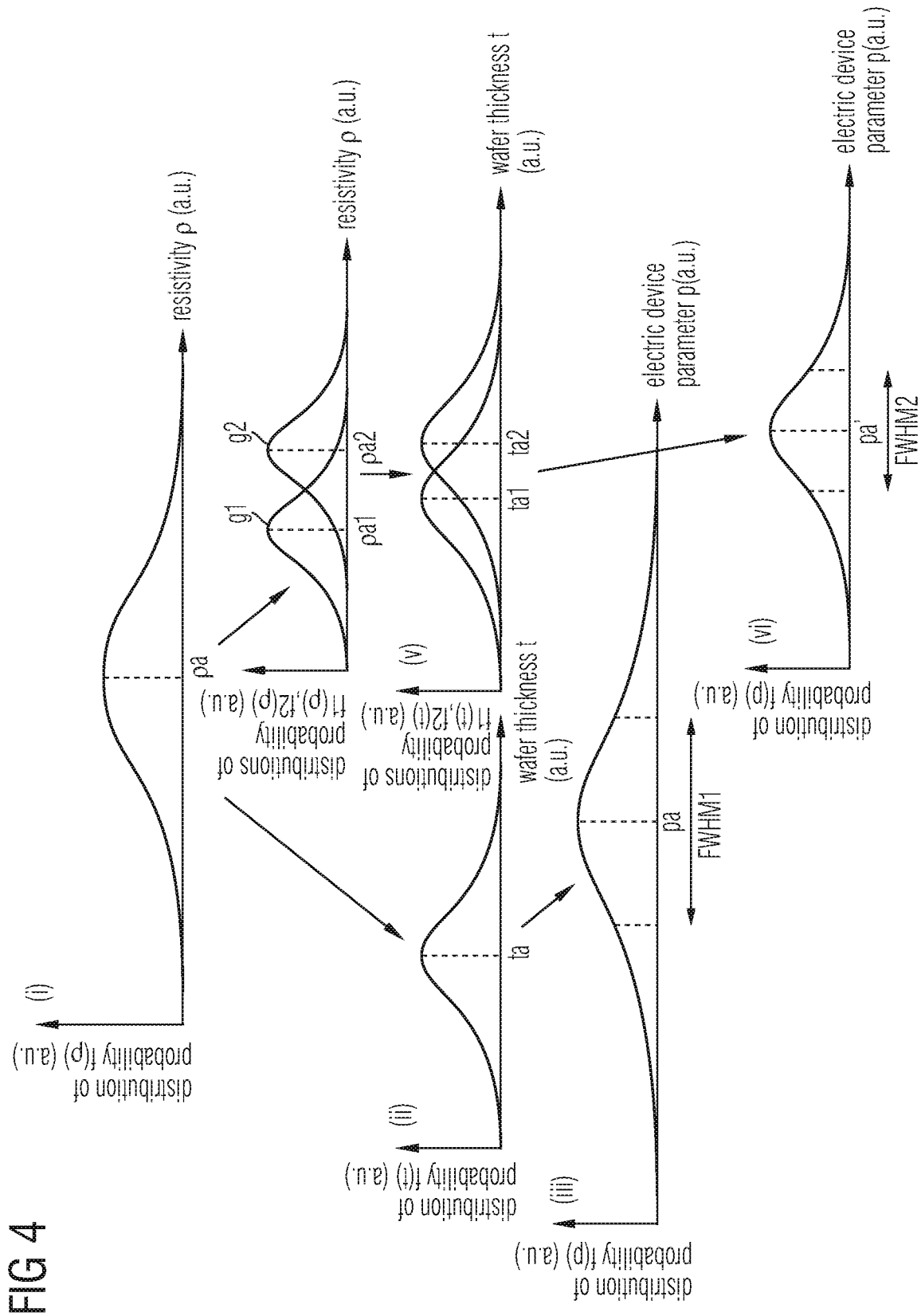
FIG. 4 are schematic views of distribution vs. characteristic graphs for illustrating different methods of manufacturing a semiconductor device.

Referring to FIG. 4, schematic graphs illustrate distributions of probability of characteristics of semiconductor wafers falling within a target wafer specification.

Referring to graph (i), a distribution of probability $f(\rho)$ of a resistivity of the semiconductor wafers falling within the target specification has a peak at an average resistivity value $\rho a$. Referring to graph (ii), a distribution of probability $f(t)$ of a wafer thickness during FEOL and BEOL processing has a peak at an average thickness value ta. The average thickness value ta is illustrated after wafer thinning during semiconductor processing. Thinning of the semiconductor wafers falling within the target specification is carried out based on same thinning parameters. Referring to graph (iii), further FEOL and BEOL processes for finalizing a semiconductor device in the semiconductor wafers result in a distribution of probability $f(p)$ of an electric device parameter p of the wafers, for example on-state resistance, or switching softness, or breakdown voltage, or cosmic radiation hardness, or short circuit ruggedness that has an average electric parameter value pa and a first full width at half maximum (FWHM) value FWHM1.

When processing the semiconductor device based on the methods as described with reference to FIGS. 2 and 3, the semiconductor wafers are divided into two sub-groups g1, g2 as is illustrated in graph (iv). A sum of a first distribution of probability f1 ($\rho$) of a resistivity of the semiconductor wafers of the first sub-group g1 and a second distribution of probability f2($\rho$) of a resistivity of the semiconductor wafers of the second sub-group g2 equals the distribution $f(\rho)$ of graph (i). The semiconductor wafers of the sub-groups g1, g2 have different average resistivity values $\rho a1$, $\rho a2$. Processing of the CZ silicon wafers is based on process parameters that at least partly differ among the CZ silicon wafers of the sub-groups g1, g2. In the illustrated embodiment, graph (v), thinning of the CZ silicon wafers of the sub-groups g1, g2 is carried out based on different thinning parameters resulting in a first distribution of probability f1($t$)(of a thickness of the semiconductor wafers of the first group g1 and a second distribution of probability f2($t$) of a thickness of the semiconductor wafers of the second group g2. The semiconductor wafers of the first and second sub-groups g1, g2 have different average wafer thickness values ta1, ta2. Other than the first and second distributions of probability f1($\rho$) and f2($\rho$), whose sum equals f($\rho$), a sum of the first and second distributions f1($t$) and f2($t$) differs from f(t) illustrated in graph (ii) due to different thinning parameters applied to the semiconductor wafers of the sub-groups g1, g2. As is illustrated in graph (vi), further FEOL and BEOL processes for finalizing a semiconductor device in the semiconductor wafers of the sub-groups g1, g2 result in a distribution f(p) of an electric device parameter p of the wafers, for example on-state resistance, or switching softness, or breakdown voltage, or cosmic radiation hardness, or short circuit ruggedness that has an average electric parameter value pa' and a second full width at half maximum (FWHM) value FWHM2 which may be set smaller than the value FWHM1 illustrated in graph (iii). The average electric parameter values pa, pa' may differ or be equal.

As is illustrated in the graphs of FIG. 5, a correlation between resistivity $\rho$ and wafer thickness t of the semiconductor wafers processed by the method illustrated in graphs (iv), (v), (vi) can be set larger than a correlation between resistivity $\rho$ and wafer thickness t of the semiconductor wafers processed by the method illustrated in graphs (ii), (iii). This is due to division of the semiconductor wafers into the sub-groups g1, g2 as is illustrated in graph (iv) and at least partly different processing of the semiconductor wafers belonging to different sub-groups. Apart from a division of the semiconductor wafers falling within a target specification into two sub-groups g1, g2, a division into three or even more sub-groups may be carried out.

Figure 6:
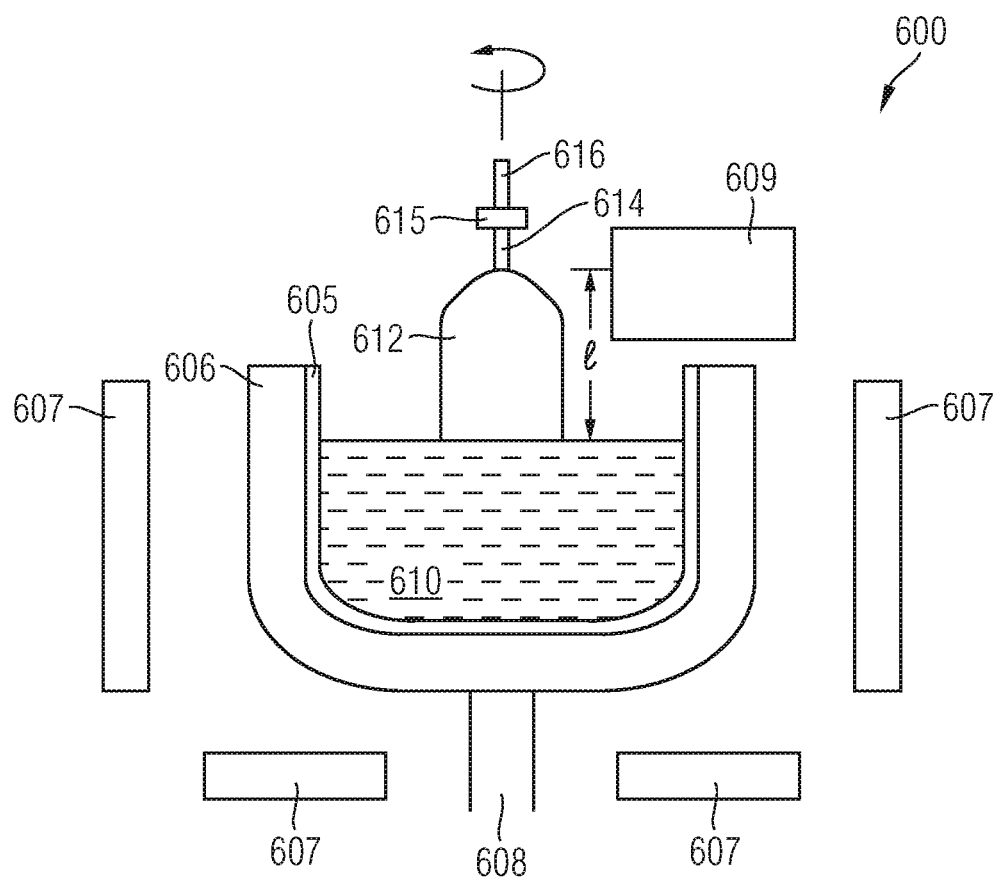
FIG. 6 is a schematic cross-sectional view of a CZ growth system

FIG. 6 is a simplified schematic cross-sectional view of a CZ growth system 600 for carrying out the method illustrated in FIG. 1.

The CZ growth system 600 includes a crucible 605, e.g. a quartz crucible on a crucible support 606, e.g. a graphite susceptor. A heater 607, e.g. a radio frequency (RF) coil surrounds the crucible. The heater 607 may be arranged at lateral sides and/or at a bottom side of the crucible 605. The crucible 605 may be rotated by a supporting shaft 608.

The mixture of silicon material, e.g. a non-crystalline raw material such as polysilicon and an n-type dopant material such as phosphorus (P), antimony (Sb), arsenic (As) or any combination thereof is melted in the crucible by heating via the heater 607. The n-type dopant material may already constitute or be part of the initial doping of the silicon material to be melted and/or may be added as a solid or gaseous dopant source material. According to an embodiment, the solid dopant source material is a dopant source particle such as a dopant source pill. The dopant source material may have a predetermined shape such as a disc shape, spherical shape or a cubic shape. By way of example, the shape of the dopant source material may be adapted to a supply device 609 such as a dispenser configured to supply the dopant source material to a silicon melt 610 in the crucible 605.

According to an embodiment, the dopant source material may include, in addition to the dopant material, a carrier material or a binder material. By way of example, the dopant source material may be quartz or silicon carbide (SiC) doped with the dopant material. According to another embodiment, the dopant source material may be a highly doped silicon material such as a highly doped polysilicon material that is doped to a greater extent than the silicon raw material. According to yet another embodiment, the dopant source material may be boron nitride and/or boron carbide.

A silicon ingot 612 is pulled out of the crucible 605 containing the silicon melt 610 by dipping a seed crystal 614 into the silicon melt 610 which is subsequently slowly withdrawn at a surface temperature of the melt just above the melting point of silicon. The seed crystal 614 is a single crystalline silicon seed mounted on a seed support 615 rotated by a pull shaft 616. A pulling rate which typically is in a range of a few mm/min and a temperature profile influence a diameter of the CZ grown silicon ingot 612.

When extracting the silicon ingot 612 with the CZ growth system 600 according to the method illustrated in FIG. 5, boron is added to the silicon melt 610 over an extraction time period. According to an embodiment, boron is added to the molten silicon at a constant rate. The boron may be added to the silicon melt 610 from a boron doped quartz material such as a boron doped quartz material supplied to the silicon melt 610 by the supply device 609. In addition or as an alternative, the boron may be added to the silicon melt 610 from a boron carbide or from a boron nitride source material that may also be supplied to the silicon melt 610 by the supply device 609.

Figure 7:
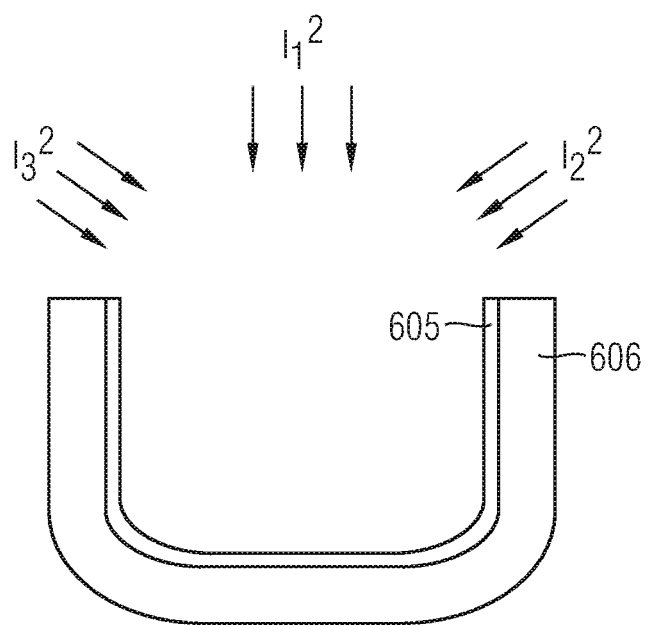
FIG. 7 is a schematic cross-sectional view of a crucible for illustrating a method of doping the crucible with dopant material.

According to another embodiment, the boron is added to the silicon melt 610 from a boron doped crucible. The boron doped crucible may be formed by implanting boron into the crucible, for example (cf. schematic cross-sectional view of FIG. 7). The boron may be implanted into the crucible 605 by one or more tilted implants, cf. labels $I_2^2$ and $I_3^2$ and/or by non-tilted implant, cf. label $I_1^2$ in FIG. 7. A distribution of tilt angle(s) may be used to adjust the amount of boron that is supplied to the silicon melt 610 by dissolving a material of the crucible 605 in the silicon melt 610, e.g. at a rate in the range of approximately 10 µm/hour in case of a crucible made of quartz. The boron may be implanted into the crucible at various energies and/or at various doses. Applying a thermal budget to the crucible 605 by heating may allow for setting a retrograde profile of the boron in the crucible 605. Multiple implants at various energies and/or doses further allow for setting a profile of the boron into a depth of the crucible 605. Thus, a rate of adding boron into the silicon melt 610 may be adjusted, i.e. by selection of implantation parameters the rate of the addition of boron can be varied and controlled in a well-defined manner. By way of example, the profile of boron in the crucible 605 may be a retrograde profile. As an alternative or in addition to implanting boron into the crucible 605, boron may also be introduced into the crucible 605 by another process, e.g. by diffusion from a diffusion source such as a solid diffusion source of boron, for example. As a further alternative or in addition to the above processes of introducing boron into the crucible 605, boron may also be introduced into the crucible 605 in-situ, i.e. during formation of the crucible 605.

According to yet another embodiment boron may be introduced into the silicon melt 610 from the gas phase, e.g. by supply of diborane ($B_2H_6$) via the supply device 609. According to an embodiment, supply of boron in the gas phase may occur via a supply of inert gas into the CZ growth system 600. According to another embodiment, supply of boron in the gas phase may occur via one or more tubes, e.g. a quartz tube extending into the silicon melt 610. According to yet another embodiment, supply of boron in the gas phase may occur via one or more tubes ending at a short distance to the silicon melt 610. The tubes may include one or more openings at an outlet, e.g. in the form of a showerhead, for example.

According to another embodiment, a liner layer may be formed on the crucible 605 for controlling diffusion of boron out of the crucible 605 into the silicon melt 610. As an example, the liner layer may be formed of quartz and/or silicon carbide. According to an embodiment, the liner layer may be dissolved in the silicon melt 610 before boron included in the crucible gets dissolved in the silicon melt 610 and serves as a dopant during the growth process of the silicon ingot 612. This allows for adjusting a point of time when boron is available in the silicon melt as a dopant to be introduced into the silicon ingot 612. The liner layer may also delay introduction of boron into the silicon melt 610 by a time period that is required for diffusion of boron from the crucible 605 through the liner layer and into the silicon melt 610.

According to another embodiment, the method of manufacturing the silicon ingot 612 further includes altering a rate of adding the boron to the silicon melt 610. According to an embodiment, altering the rate of adding the boron to the silicon melt 610 includes altering at least one of size, geometry, and rate of delivery of particles including the boron. By way of example, the rate may be increased by increasing a diameter of the particles doped with the dopant material. As an additional or alternative measure, the rate of adding the boron to the silicon melt 610 may be increased by increasing a speed of supplying the dopant source material into the silicon melt 610 by the supply device 609.

Figure 8:
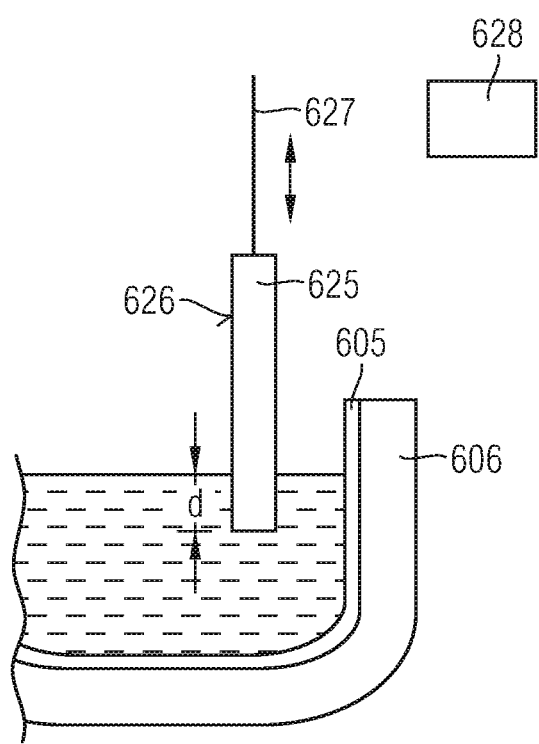
FIG. 8 is a schematic cross-sectional view of a part of a CZ growth system for illustrating a method of adding dopants to a silicon melt in the crucible.

According to another embodiment illustrated in the schematic cross-sectional view of FIG. 8, altering the rate of adding the boron to the silicon melt 610 includes altering a depth d of a dopant source material 625 dipped into the silicon melt 610.

According to another embodiment, altering the rate of adding the boron to the silicon melt 610 includes altering a temperature of the dopant source material 625. By way of example, by increasing a temperature of the dopant source material, e.g. by heating, the amount of boron introduced into the silicon melt 610 out of the dopant source material 625 may be increased. The dopant source material 625 is doped with the boron. According to an embodiment, doping of the dopant source material is carried out by one of in-situ doping, a plasma deposition process through a surface 626 of the dopant source material 625, ion implantation through the surface 626 of the dopant source material 625 and a diffusion process through the surface 626 of the dopant source material 625. The dopant source material 625 may be shaped as a bar, a cylinder, a cone or a pyramid, for example. The dopant source material 625 may also be made of a plurality of separate dopant source pieces having one or a combination of different shapes. The depth d of a part of the dopant source material 625 that is dipped into the silicon melt 610 may be changed by a puller mechanism 627. The puller mechanism 627 holds the dopant source material 625, dips the dopant source material 625 into the silicon melt 610 and also pulls the dopant source material 625 out of the silicon melt 610. A control mechanism 628 is configured to control the puller mechanism 627. The control mechanism 628 may control the puller mechanism 627 by wired or wireless control signal transmission, for example.

According to another embodiment, altering the rate of adding the boron to the silicon melt 610 includes altering a flow or partial pressure of a boron carrier gas, e.g. diborane ($B_2H_6$) when doping the silicon melt 610 with boron from the gas phase.

According to an embodiment, the rate of adding the boron to the silicon melt 610 may be controlled depending on a length of the silicon ingot 612 from the seed crystal 614 to the silicon melt 610 during growth. According to another embodiment, the rate of adding the boron to the silicon melt 610 may be controlled based on a result of measuring a weight of the silicon ingot 612 and/or the dopant source material 625 during the Czochralski growth process. By way of example, the weight of the silicon ingot 612 and/or the dopant source material 625 may be measured by hanging up the silicon ingot 612 and/or the dopant source material 625 at a weighting unit, for example.

According to an embodiment, boron or another p-type dopant may be added prior to and/or during CZ growth by a p-dopant source material such as a p-dopant source pill. The p-dopant source material may have a predetermined shape such as a disc shape, spherical shape or a cubic shape. By way of example, the shape of the p-dopant source material may be adapted to the supply device 609 such as a dispenser configured to supply the p-dopant source material to a silicon melt 610 in the crucible 605. A time-dependent supply of a p-dopant into the silicon melt 610 may be achieved by adjusting a profile of p-type dopant concentration into a depth of the p-dopant source material, for example by multiple ion implantations at different energies and/or by forming a liner layer surrounding the p-dopant source material for controlling dissolving of the p-dopant from the p-dopant source material into the silicon melt 610 or for controlling the diffusion of the p-dopant out of the p-dopant source material into the silicon melt 610.

According to another embodiment, controlling the rate of adding the boron to the silicon melt 610 is carried out by optically measuring a change in dimensions of a quartz source material doped with the boron. Entrance of measurement light into the quartz source material may occur through a part of the quartz source material that protrudes from the silicon melt 610, for example. Altering the rate of adding the boron to the silicon melt 610 may also be carried out by altering at least one of a contact area between a dopant source material and the silicon melt and heating of the dopant source material. By altering the rate of adding boron to the silicon melt 610, an effective segregation of boron during CZ growth can be adapted to the segregation behavior of the n-type dopant(s) so as to achieve an n-type doping partially compensated by 20% to 80% with boron.

According to another embodiment, the net n-type doping is further compensated by a p-type dopant species having a segregation coefficient smaller than phosphorus in addition to boron. According to yet another embodiment, the net n-type doping is further compensated by a plurality of different p-type dopant species having segregation coefficients smaller than phosphorus. Carrying out partial compensation by boron having a segregation coefficient greater than phosphorus and by one or more p-type dopant species having segregation coefficients smaller than phosphorus, an effective segregation of p-type dopants during CZ growth can be adapted to the segregation behavior of phosphorus. This allows for a very effective compensation even in the case that source material is implemented prior to the start of the melting process. Gallium and aluminum are examples of p-type dopant species having a segregation coefficient smaller than phosphorus. The value of the resulting effective segregation coefficient can be adjusted by the ratio between the p-type dopant species with higher segregation coefficient and the p-type dopant species with lower segregation coefficient. Typically, the ratio between B and Al or Ga is at least 2, or even higher than 5 or even higher than ten for the case of phosphorus doping.

The embodiment of a method for manufacturing the silicon ingot described above includes a partial compensation where donors in the n-doped silicon ingot outnumber boron and optional further p-type dopants that are added to the silicon melt during CZ growth.

An axial profile of doping caused by segregation of dopant material during CZ growth can be approximated by equation (1) below:

$$c(p) = k_0 c_0 (1-p)^{k_0-1} + F_0 \frac{k_0}{1-k_0}[(1-p)^{k_0-1} - 1] \quad (1)$$

The first term in the equation (1) refers to a doping that has been added to the melt before extracting the silicon ingot from the melt. According to the above embodiments, n-type dopant materials may be described by the first term of equation (1). The second term refers to adding dopant material at a constant rate into the melt during CZ growth. According to the above embodiments, adding the boron may be described by the second term of equation (1).

In the above equation (1), $c(p)$ denotes a concentration of the dopant material in the silicon ingot (atoms/cm$^3$), p denotes a portion of the initial melt during CZ growth that has been crystallized and corresponds to an axial position between 0% and 100% of the completely grown silicon ingot, $k_0$ denotes a segregation coefficient of the dopant material, e.g. approx. 0.8 for boron (B) in silicon and approx. 0.35 for phosphorus (P) in silicon, $c_0$ denotes an initial concentration of the dopant material in the melt (atoms/cm$^3$) and $F_0$ denotes a total amount of the dopant material that is constantly (relative to the pulling rate) added to the melt divided by the initial volume of the melt (atoms/cm$^3$).

Figure 9:
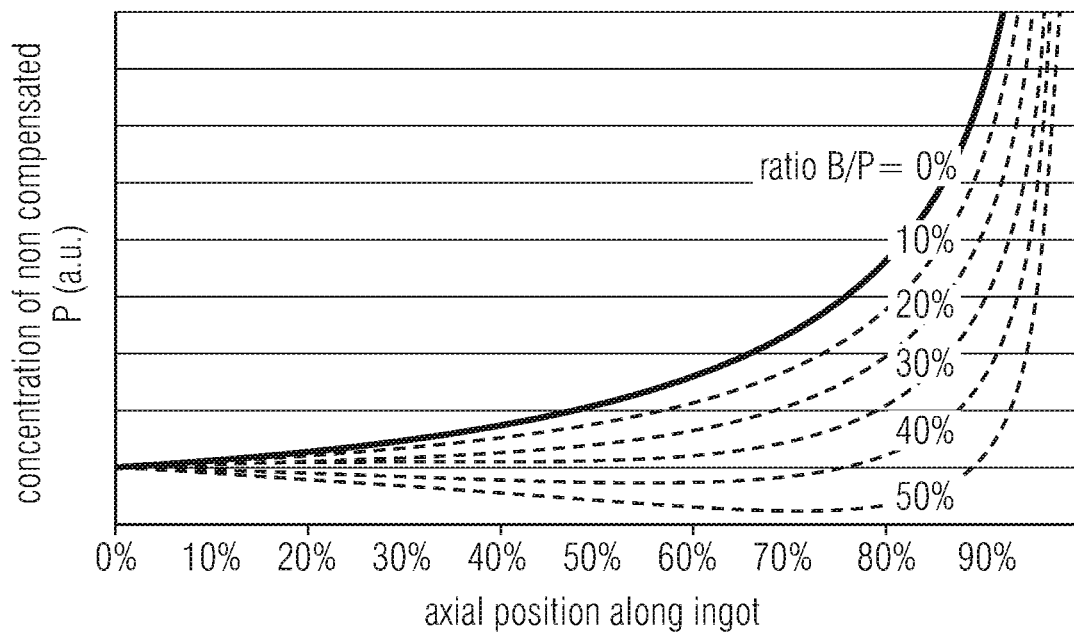
FIG. 9 is a graph illustrating a simulated concentration of non-compensated phosphorus along an axial position of a CZ grown silicon ingot with respect to different ratios of boron and phosphorus added to the silicon melt.

FIG. 9 illustrates calculated concentrations of non-compensated phosphorus (P), i.e. net n-doping versus an axial position between opposite ends of a silicon ingot. The illustrated curves refer to different ratios of boron (B) and phosphorus (P), i.e. $F_{OB}/c_{OP}$ corresponding to the ratio of the total amount of boron that is constantly (relative to the pulling rate) added to the silicon melt divided by the initial volume of the melt ($F_{OB}$ in atoms/cm$^3$) and an initial concentration of phosphorus in the melt ($c_{OP}$ in atoms/cm$^3$).

The illustrated curves refer to values of $F_{OB}/c_{OP}$ of 0%, 10%, 20%, 30%, 40%, 50%. By adding boron to the melt during CZ growth and thereby adding a compensation dopant to the melt during the CZ growth, the method described with reference to FIGS. 5 to 8 allows for silicon wafers suitable for manufacturing semiconductor devices having improved robustness and reliability. When adding the boron to the melt before initiating CZ growth of the silicon ingot, homogeneity of the net n-doping concentration along the axial direction between opposite ends of the silicon ingot may be even worse than for the case of $F_{OB}/c_{OP}$ of 0%, i.e. without adding boron. This is due to the larger segregation coefficient of the compensation dopant boron compared to the segregation coefficient of the n-type dopant such as phosphorus.

Figure 10:
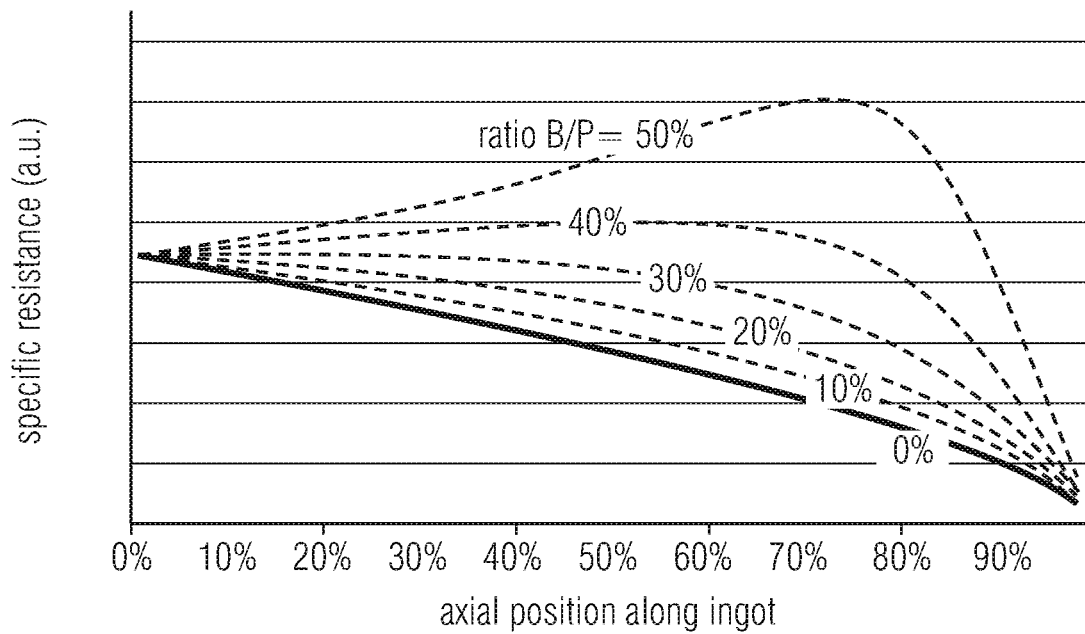
FIG. 10 is a graph illustrating a simulated specific resistance along an axial position of a CZ grown silicon ingot with respect to different ratios of boron and phosphorus added to the silicon melt.

FIG. 10 illustrates calculated specific resistance curves versus an axial position between opposite ends of a silicon ingot. Similar to the parameter curves illustrated in FIG. 9, the curves illustrated in FIG. 10 refer to different ratios of boron (B) and phosphorus (P), i.e. $F_{OB}/c_{OP}$ corresponding to the ratio of the total amount of boron that is constantly (relative to the pulling rate) added to the silicon melt divided by the initial volume of the melt ($F_{OB}$ in atoms/cm$^3$) and an initial concentration of phosphorus in the melt ($c_{OP}$ in atoms/cm$^3$).

Similar to the parameter curves illustrated in FIG. 9, the curves illustrated in FIG. 10 refer to values of $F_{OB}/c_{OP}$ of 0%, 10%, 20%, 30%, 40%, 50%. By adding boron to the melt during CZ growth and thereby adding a compensation dopant to the melt during the CZ growth, the method described with reference to FIGS. 5 to 8 allows for improving homogeneity of the specific resistance along the axial direction between opposite ends of the silicon ingot and for silicon wafers suitable for manufacturing semiconductor devices having improved robustness and reliability.

Based on the method illustrated and described with respect to FIGS. 5 to 10, table 1 illustrates a maximum portion of the ingot along the axial direction having a specific fluctuation of specific resistance and a specific ratio of boron (B) and phosphorus (P), i.e. $F_{OB}/c_{OP}$ corresponding to the ratio of the total amount of boron that is constantly (relative to the pulling rate) added to the silicon melt divided by the initial volume of the melt ($F_{OB}$ in atoms/cm$^3$) and an initial concentration of phosphorus in the melt ($c_{OP}$ in atoms/cm$^3$). Table 1 refers to values of $F_{OB}/c_{OP}$ of 0%, 10%, 20%, 30%, 40%, 50%, and to axial fluctuations of the specific resistance of +/−5%, +/−10%, +/−15%, +/−20%, +/−30%, +/−50%. By adding boron to the melt during CZ growth and thereby adding a compensation dopant to the melt during the CZ growth, the method described with reference to FIGS. 4 to 10 allows for a yield improvement by increasing the maximum portion of the ingot along the axial direction having a specific fluctuation of specific resistance. As an example, the axial portion of the ingot having a fluctuation of specific resistance of +/−10% may be increased from 26% (no compensation doping) to 78% (compensation doping $F_{OB}/c_{OP}$ of 40%).

TABLE 1

| boron compensation flow/initial doping with phosphorous | maximum ingot length with axial fluctuation of specific resistance of | | | | | |
|---|---|---|---|---|---|---|
| | +/−5% | +/−10% | +/−15% | +/−20% | +/−30% | +/−50% |
| no compensation | 14% | 26% | 36% | 46% | 60% | 80% |
| 20% | 32% | 48% | 58% | 66% | 76% | 88% |
| 30% | 56% | 66% | 74% | 78% | 84% | 92% |
| 35% | 66% | 74% | 78% | 82% | 86% | 92% |
| 40% | 38% | 78% | 82% | 84% | 88% | 92% |
| 45% | 22% | 44% | 84% | 86% | 88% | 94% |

According to the method illustrated with respect to FIGS. 9 to 10, boron is constantly added (relative to the pulling rate) to the silicon melt (described by the term $F_{OB}$ in atoms/cm$^3$) and phosphorus is added as an initial concentration to the melt (described by the term $c_{OP}$ in atoms/cm$^3$). According to other embodiments, boron may be added to the melt at an altering rate. Apart from or in addition to phosphorus, other n-type dopant materials such as antimony or arsenic may be used.

In addition to adding boron to the melt during CZ growth a part of the overall boron may also be added to the melt before CZ growth which may be described by a term $c_{OB}$ in equation (1). Likewise, in addition to adding phosphorus or another n-type dopant material as an initial concentration to the melt, a part of the phosphorus or the other n-type dopant may also be added to the melt during CZ growth which may be described by a term $F_{OP}$ in equation (1) in case of constantly adding the phosphorus or the other n-type dopant material relative to the pulling rate.

Slicing of the silicon ingot into silicon wafers may be carried out perpendicular to a central growth axis of the silicon ingot. According to an embodiment, slicing is carried out by an appropriate slicing tool such as an inner-diameter (ID) saw or a wire type saw, for example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing Czochralski (CZ) silicon wafers, comprising:
   slicing an n-type CZ silicon ingot to form a plurality of CZ silicon wafers;
   determining a boron concentration of each CZ silicon wafer;
   dividing the CZ silicon wafers into sub-groups based on the boron concentration, wherein an average value of the boron concentration differs among the sub-groups; and
   labeling each sub-group of CZ silicon wafers with a different label which is indicative of the boron concentration.

2. The method of claim 1, wherein the labeling distinguishes between the CZ silicon wafers of different sub-groups by a position in a shipping case.

3. The method of claim 1, wherein the labeling distinguishes between the CZ silicon wafers of different sub-groups by a mark on the CZ silicon wafers.

4. The method of claim 1, wherein determining the boron concentration of each CZ silicon wafer includes measuring the boron concentration of each CZ silicon wafer.

5. The method of claim 1, wherein determining the boron concentration of each CZ silicon wafer includes measuring the boron concentration of a CZ silicon ingot section.

6. The method of claim 1, wherein determining the boron concentration of each CZ silicon wafer is based on its position in the CZ silicon wafer.

7. The method of claim 1, wherein slicing the CZ silicon ingot includes slicing the CZ silicon ingot to from a CZ silicon ingot section and then slicing the CZ silicon ingot section.

8. The method of claim 7, wherein determining the boron concentration of each CZ silicon wafer includes measuring the boron concentration of the CZ silicon wafer section before slicing the ingot section.

9. The method of claim 1, further comprising:
   prior to slicing the n-type CZ silicon ingot, extracting the n-type silicon ingot from a silicon melt including n-type dopants over an extraction period; and
   adding p-type dopants to the silicon melt over at least a portion of the extraction period to compensate the n-type dopants in the silicon melt by 20% to 80%.

* * * * *

UNITED STATES PATENT AND TRADEMARK OFFICE
CERTIFICATE OF CORRECTION

PATENT NO. : 10,837,120 B2  
APPLICATION NO. : 16/830603  
DATED : November 17, 2020  
INVENTOR(S) : Freund et al.

Page 1 of 1

It is certified that error appears in the above-identified patent and that said Letters Patent is hereby corrected as shown below:

In the Claims

Column 16, Line 41, in Claim 7, delete "to from" and insert in place thereof --to form--.

Signed and Sealed this
Second Day of March, 2021

Drew Hirshfeld
*Performing the Functions and Duties of the
Under Secretary of Commerce for Intellectual Property and
Director of the United States Patent and Trademark Office*